US008587031B2

(12) United States Patent
Lu et al.

(10) Patent No.: US 8,587,031 B2
(45) Date of Patent: Nov. 19, 2013

(54) DUAL-GATE NORMALLY-OFF NITRIDE TRANSISTORS

(75) Inventors: Bin Lu, Cambridge, MA (US); Tomas Palacios, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 13/557,414

(22) Filed: Jul. 25, 2012

(65) Prior Publication Data
US 2013/0020614 A1 Jan. 24, 2013

Related U.S. Application Data

(63) Continuation of application No. PCT/US2011/024168, filed on Feb. 9, 2011.

(60) Provisional application No. 61/302,661, filed on Feb. 9, 2010.

(51) Int. Cl.
H01L 29/66 (2006.01)

(52) U.S. Cl.
USPC 257/194; 257/76; 257/E21.407; 257/E29.264; 438/172

(58) Field of Classification Search
USPC .......... 257/194, E29.246, E21.403, E21.407, 257/E29.264; 438/167, 172
See application file for complete search history.

(56) References Cited

U.S. PATENT DOCUMENTS

| 4,663,547 | A | 5/1987 | Baliga et al. |
| 7,202,528 | B2 | 4/2007 | Sankin et al. |
| 7,629,632 | B2 | 12/2009 | Twynam |
| 7,692,263 | B2 | 4/2010 | Wu et al. |
| 7,728,356 | B2 | 6/2010 | Suh et al. |
| 7,745,849 | B2 | 6/2010 | Briere |
| 7,795,642 | B2 | 9/2010 | Suh et al. |
| 7,820,511 | B2 | 10/2010 | Sankin et al. |
| 2002/0017648 | A1 | 2/2002 | Kasahara et al. |
| 2006/0006415 | A1 | 1/2006 | Wu et al. |
| 2006/0102929 | A1 | 5/2006 | Okamoto et al. |
| 2007/0102727 | A1* | 5/2007 | Twynam ........................ 257/194 |
| 2007/0278518 | A1 | 12/2007 | Chen et al. |
| 2009/0206363 | A1 | 8/2009 | Machida et al. |
| 2011/0006346 | A1* | 1/2011 | Ando et al. ................... 257/192 |
| 2012/0248532 | A1* | 10/2012 | Lu ................................ 257/334 |

OTHER PUBLICATIONS

Lanford et al., "Recessed-gate enhancement-mode GaN HEMT with high threshold voltage" Electronics Letters Mar. 31, 2005, vol. 41, No. 7, pp. 1-2.

(Continued)

*Primary Examiner* — Jarrett Stark
*Assistant Examiner* — Shahed Ahmed
(74) *Attorney, Agent, or Firm* — Gesmer Updegrove LLP

(57) ABSTRACT

A dual-gate normally-off nitride transistor that includes a first gate structure formed between a source electrode and a drain electrode for controlling a normally-off channel region of the dual-gate normally-off nitride transistor. A second gate structure is formed between the first gate structure and the drain electrode for modulating a normally-on channel region underneath the second gate structure. The magnitude of the threshold voltage of the second gate structure is smaller than the drain breakdown of the first gate structure for proper operation of the dual-gate normally-off nitride transistor.

21 Claims, 5 Drawing Sheets

(56) References Cited

OTHER PUBLICATIONS

Oka, "AlGaN/GaN Recessed MIS-Gate HFET With High-Threshold-Voltage Normally-Off Operation for Power Electronics Applications" IEEE Electron Device Letters, Jul. 2008, vol. 29, No. 7, pp. 668-670.

Higashiwaki et al., "Enhancement-Mode AlN/GaN HFETs Using Cat-CVD SiN" IEEE Transactions on Electron Devices, vol. 54, No. 6 Jun. 2007, pp. 1566-1570.

Ohmaki et al., "Enhancement-Mode AlGaN/AlN/GaN High Electron Mobility Transistor with Low On-State Resistance and High Breakdown Voltage" Japanese Journal of Applied Physics, vol. 45, No. 44, 2006, pp. 1168-1170.

Kanamura et al., "Enhancement-Mode GaN MIS-HEMTs with n-GaN/i-AlN/n-GaN Triple Cap Layer and High-k Gate Dielectrics" IEEE Electron Device Letters, vol. 31, No. 3, Mar. 2010, pp. 189-191.

Saito et al., "High Breakdown Voltage AlGaN-GaN Power-HEMT Design and High Current Density Switching Behavior" IEEE Transactions on Electron Devices, vol. 50, No. 12, Dec. 2003, pp. 2528-2531.

Cai et al., "High-performance Enhancement-Mode AlGaN/GaN HEMTs Using Fluoride-Based Plasma Treatment" IEEE Electron Device Letters, vol. 26, No. 7, Jul. 2005, pp. 435-437.

Im et al., "Normally Off GaN MOSFET Based on AlGaN/GaN Heterostructure with Extremely High 2DEG Density Grown on Silicon Substrate".

Ventury et al., "Performance and RF Reliability of GaN-on-SiC HEMT's using Dual-Gate Architectures" Microwave Symposium Digest 2006, IEEE, Jun. 1, 2006, pp. 714-717.

Wang et al., "Gain Improvement of Enhancement-Mode AlGaN/GaN High-Electron-Mobility Transistors Using Dual-Gate Architecture" Japanese Journal of Applied Physics, Japan Society of Applied Physics, JP, vol. 47, No. 4, Apr. 1, 2008, pp. 2820-2823.

The International Search Report issued on May 16, 2011 in connection with corresponding PCT Application No. PCT/US2011-024168.

\* cited by examiner

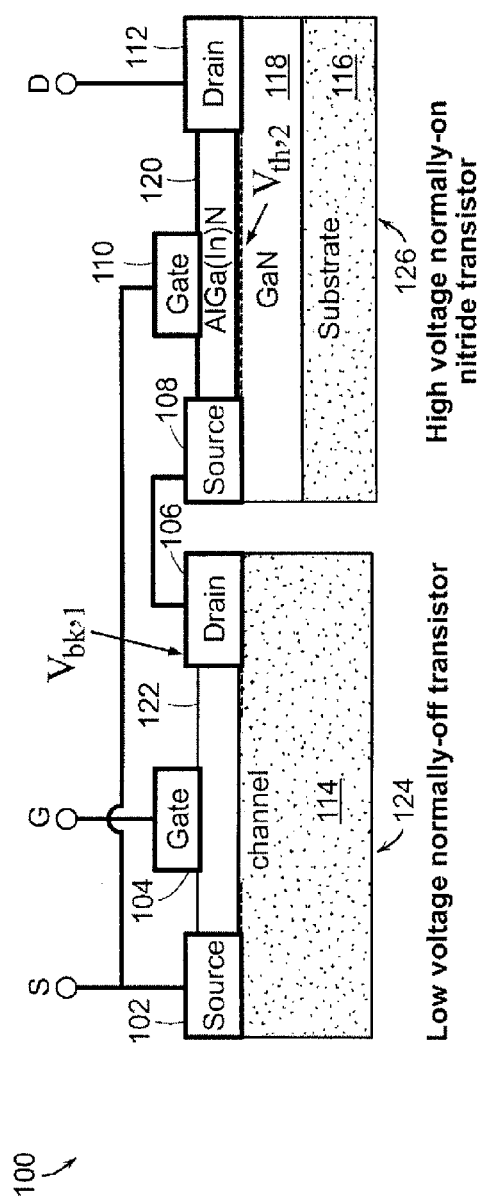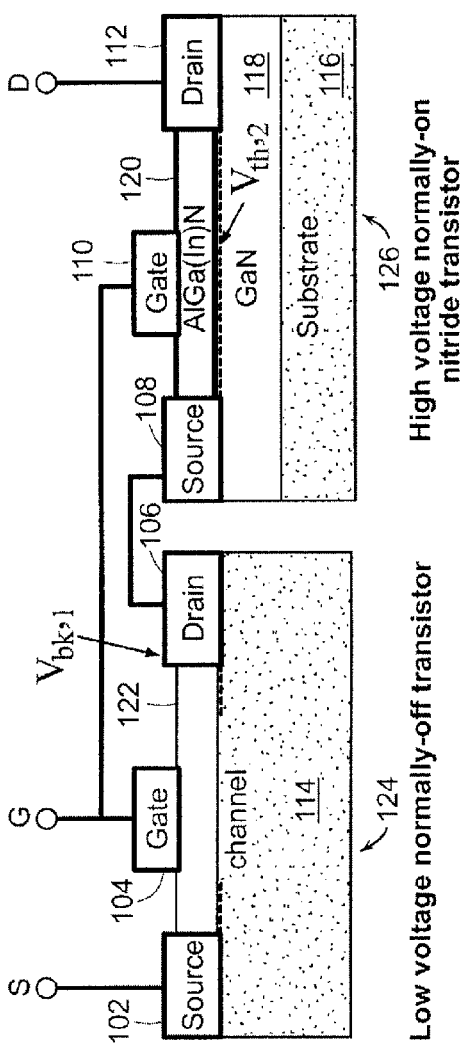

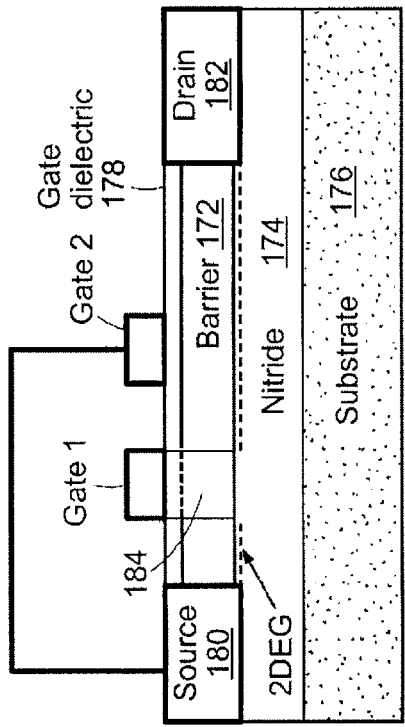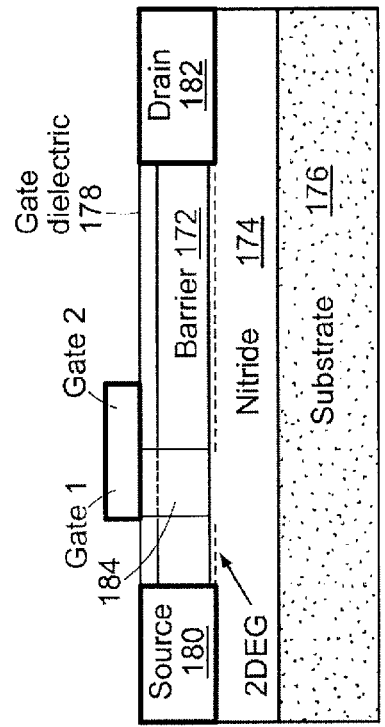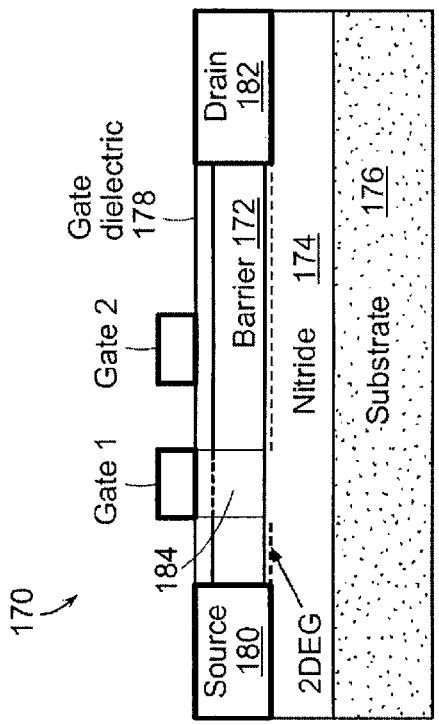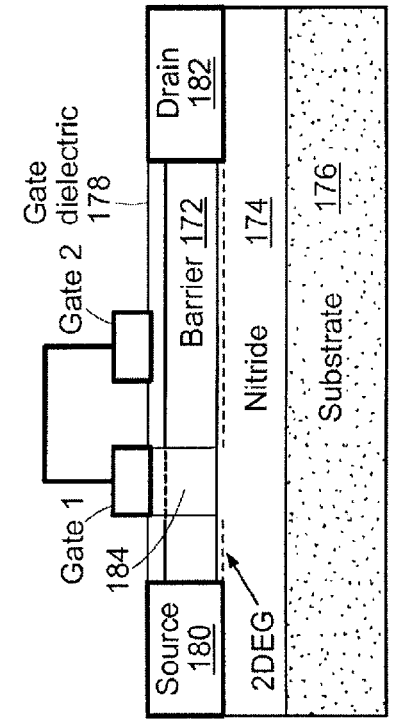
FIG. 2A
FIG. 2B
FIG. 2C
FIG. 2D

US 8,587,031 B2

DUAL-GATE NORMALLY-OFF NITRIDE TRANSISTORS

PRIORITY INFORMATION

This application is a continuation of PCT Application No. PCT/US2011/24168 filed on Feb. 9, 2011 and claims priority from provisional application Ser. No. 61/302,661 filed Feb. 9, 2010 both of which are incorporated herein by reference in their entireties.

SPONSORSHIP INFORMATION

This invention was made with government support under Contract No. FA8721-05-C-0002 awarded by the U.S. Air Force. The government has certain rights in this invention.

BACKGROUND OF THE INVENTION

The invention is related to the field of nitride devices and in particular the fabrication of high performance normally-off nitride transistors.

Group III-Nitride semiconductors are very promising for power electronics applications due to their combination of high critical electric field (~3.3 MV/cm) and high electron density ($n_e > 10^{13}$ cm$^{-2}$) and mobility (1500-2000 cm$^2$/Vs) of the two-dimensional electron gas (2DEG) in the Al(In)GaN/GaN high mobility electron transistors (HEMTs). Comparing with Si power switches, more than three orders of magnitude reduction of specific on-resistance ($R_{sp,on}$) are expected from the GaN-based power switches. GaN-based power converters will enable more efficient and compact power conversion systems than the Si-based converters.

The standard Al(In)GaN/GaN HEMTs are depletion-mode (D-mode) devices. However, enhancement-mode (E-mode) transistors are highly desirable for power electronics as they can greatly simplify circuit designs and improve system reliability. The challenge of making E-mode GaN-based transistors is to maintain low on-resistance ($R_{on}$) while have a high breakdown voltage (By). Due to the reduced channel mobility and/or limited gate-voltage swing, the channel resistance is a major contribution to the on-resistance of the E-mode GaN-based transistors fabricated by methods in the prior arts, such as the gate recess. Reducing the gate length can reduce the channel resistance. However, the breakdown voltage is also reduced with short gate length.

A composite control circuit which includes a low voltage normally-off gating device connected in series with a normally-on high voltage device can be applied to nitride semiconductors to fabricate high voltage composite normally-off device. Since the normally-off device is a low voltage device, its on-resistance will only be a small portion of the composite device, while the high voltage normally-on nitride device can support the off-state high voltage. However, these two devices need to be brought together in a very close proximity to reduce parasitic.

SUMMARY OF THE INVENTION

According to one aspect of the invention, there is provided a dual-gate normally-off nitride transistor. A dual-gate normally-off nitride transistor includes a first gate structure formed between a source electrode and a drain electrode for controlling a normally-off channel region of the dual-gate normally-off nitride transistor. A second gate structure is formed between the first gate structure and the drain electrode for modulating a normally-on channel region underneath the second gate structure. The magnitude of the threshold voltage of the second gate structure is smaller than the drain breakdown of the first gate structure for proper operation of the dual-gate normally-off nitride transistor.

According to another aspect of the invention, there is provided a method of forming a dual-gate normally-off nitride transistor. The method includes forming a first gate structure between a source electrode and a drain electrode for controlling a normally-off channel region of the dual-gate normally-off nitride transistor. Also, the method includes forming a second gate structure between the first gate structure and the drain electrode for modulating a normally-on channel region underneath the second gate structure. The magnitude of the threshold voltage of the second gate structure is smaller than the drain breakdown of the first gate structure for proper operation of the dual-gate normally-off nitride transistor.

According to another aspect of the invention, there is provided a transistor-based power device. The transistor-based power device includes a first gate structure for controlling an off region of the dual-gate normally-off HEMT structure. A second gate structure is coupled to the first gate structure. The first gate structure and second gate structure modulate a channel structure and requiring that the magnitude of the threshold voltage of the second gate structure is smaller than the drain breakdown of the first gate structure for proper operation of the transistor-based power structure.

BRIEF DESCRIPTION OF THE DRAWINGS

FIGS. 1A-1B are circuit schematics illustrating the concept of normally-off dual-gate nitride transistors;

FIGS. 2A-2D are the schematics illustrating the monolithically fabricated dual-gate nitride transistors with the configuration of the second gate connected to the source electrode, connected to the first gate and integrated with the first gate;

DETAILED DESCRIPTION OF THE INVENTION

Figure 3A:
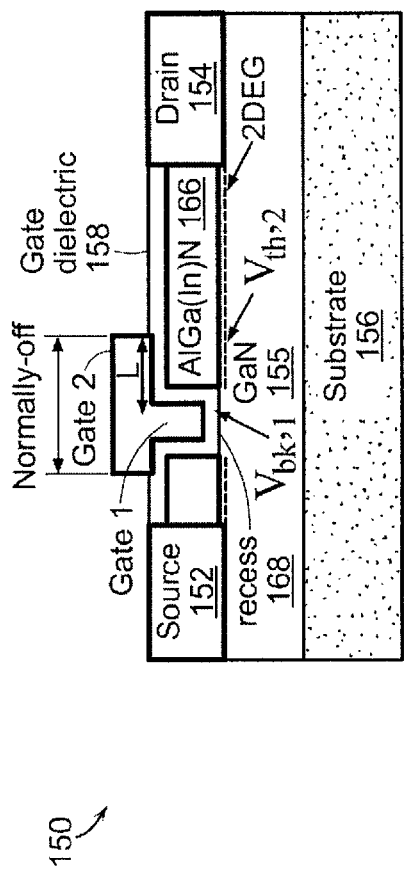
FIGS. 3A-3C are schematic diagrams illustrating three different embodiments of the dual-gate normally-off nitride transistor with a integrated dual-gate structure.

The invention describes a novel nitride power device (normally-off dual-gate nitride transistor) which monolithically combines in a single device a low voltage normally-off nitride transistor with a high voltage normally-on nitride transistor. The invention can be applied to various energy systems. Some examples of these systems include hybrid vehicles and renewable energy systems such as solar and wind farms.

The novel normally-off dual-gate nitride transistors are based on the idea of combining a low voltage normally-off transistor 124, with a high voltage normally-on nitride transistor 126 as shown in FIGS. 1A-1B. The nitride transistor 126 can be either AlGaN/GaN HEMT or AlInN/GaN HEMT, or any other nitride device. It should be noted that this invention can also be used for diamond and SiC-based power transistors. However, the use of III-N semiconductors offers additional flexibility and performance.

When the novel device is operated in the pinch-off condition ($V_{gs}=0$), the drain voltage ($V_{ds}$) is mainly dropped at the drain-to-gate region 120 of the high voltage normally-on AlGa(In)N/GaN HEMT 126, while the gate 104 of the low voltage normally-off transistor 124 maintains the normally-off operation of the dual gate device. When a positive gate voltage is applied, the normally-off transistor 124 will be turned on and the current will be allowed to flow through the entire device. An important requirement for making the normally-off dual gate device is that the magnitude of the threshold voltage of the normally-on AlGaN(In)N/GaN HEMT 126, $|V_{th,2}|$, ($V_{th,2}<0$), is smaller than the drain breakdown voltage (or punch-through voltage) of the normally-off device 124, $V_{bk,1}$ ($|V_{th,2}|<V_{bk,1}$).

The on-resistance of the novel power device 100 will be composed of the resistance of the low voltage normally-off transistor 124 and high voltage normally-on AlGa(In)N/GaN HEMT 126. The low voltage normally-off transistor 124 can be made of Si n-MOSFET or a normally-off AlGa(In)N/GaN HEMT fabricated by gate recess, plasma treatment, dipole engineering, p-AlGaN barrier, surface potential engineering with SiN or other dielectric, or any other method or combination of them. Key to this invention is the fact that since the normally-off transistor 124 only supports low voltages, it can have a much narrower gate length than the normally-on AlGa(In)N/GaN HEMT 126, therefore reducing its impacts to the total on-resistance. This technology can also be used in AlInN/GaN HEMTs and any other transistor technology where low-resistance high-voltage E-mode devices are needed.

A normally-off transistor 100 can be formed by connecting a low voltage normally-off transistor 124 with high voltage AlGaN/GaN HEMTs 126: (a) the gate 110 of the high voltage normally-on AlGaN/GaN HEMT 126 is connected to the source 102 of the low voltage normally-off transistor 124 as shown in FIG. 1A; (b) the two gates 104, 110 of AlGaN/GaN HEMT 126 and the low voltage normally-off transistor 124 are connected as shown in FIG. 1B.

The drain 106 of the low voltage normally-off transistor 124 is connected to the source 108 of the high voltage high voltage normally-on AlGaN/GaN HEMT 126. The source 102 and the drain 106 of the low voltage normally-off transistor 124 are positioned on a channel layer 114. The gate 104 of the low voltage normally-off transistor 124 is positioned on a dielectric layer 122. The source 108 and drain 112 of the high voltage normally-on AlGaN/GaN HEMT 126 are positioned on a GaN semiconductor layer 118. The GaN semiconductor layer 118 is positioned on a substrate 116.

In order to reduce the area and parasitics of the dual-gate normally-off HEMT 100 as shown in FIGS. 1A-1B, the two transistors 124, 126 need to be as close to each other as possible. For the approach using Si n-MOSFET as the low voltage normally-off transistor 124, a Si—GaN wafer integration technology could be used. If the same semiconductor material is used for both the E-mode and D-mode devices, the dual-gate structure can be monolithically fabricated as shown in FIGS. 2A-2D.

FIG. 2A shows a device 170 having a nitride layer 174, such as GaN, formed on a substrate 176; and a barrier layer 172 of $Al_xGa_{1-x}N$ or $In_xGa_{1-x}N$ formed on the nitride layer 174, which induces a two-dimensional-electron-gas (2DEG) in the nitride layer 174. A source electrode 180 and a drain electrode 182 are in contact with the 2DEG. Gate 1 is formed in between the source electrode 180 and the drain electrode 182, on the barrier layer 172. Gate 1 is a normally-off gate which interrupts the 2DEG in the channel region 184 underneath Gate 1. Gate 2 is formed between Gate 1 and the drain electrode 182 on a dielectric layer 178. The 2DEG underneath Gate 2 is maintained so that Gate 2 is a normally-on gate. Gate 2 can be connected to the source electrode 180 as shown in FIG. 2B or shorted to Gate 1 as shown in FIG. 2C.

Gate 2 can have an independent bias from Gate 1 as shown in FIG. 2A. When Gate 2 is connected to Gate 1, Gate 2 can be integrated with Gate 1 as shown in FIG. 2D.

Figure 3C:
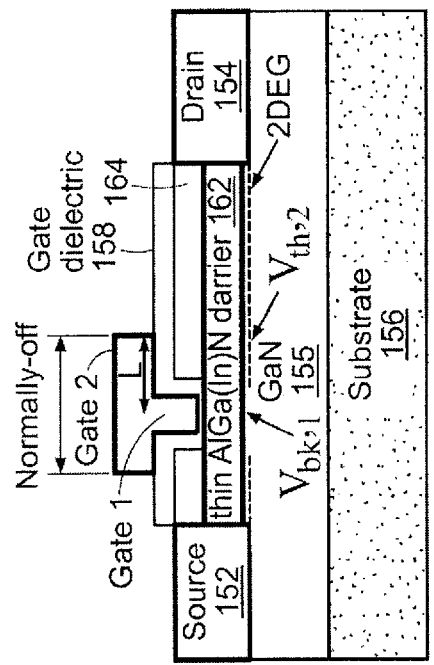
Figure 3B:
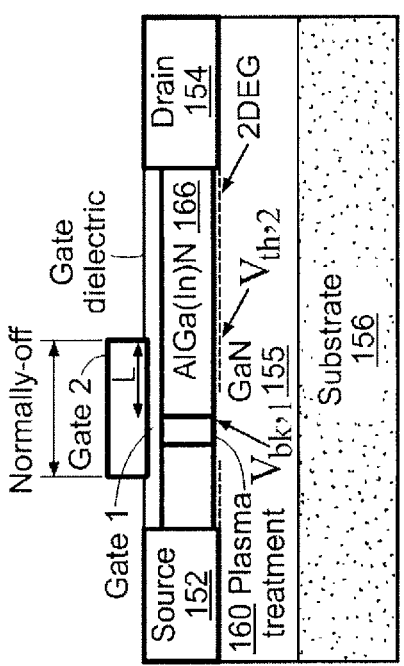

FIGS. 3A-3C show three embodiments of the dual-gate normally-off nitride transistor with the second gate integrated with the first gate a) by gate recess, as shown in FIG. 3A, b) by plasma treatment, as shown in FIG. 3B, c) by SiN or other dielectric changing surface potential as shown in FIG. 3C.

The Gate 1 controls the normally-off region of the device and the Gate 2 supports the voltage drop from the drain. Gate 1 and Gate 2 are connected. The $V_{bk,1}$ is the breakdown voltage or punch-through voltage associated with Gate 1 and $V_{th,2}$ is the threshold voltage of the normally-on channel underneath the Gate 2 of a length L. The Gate 1 controls the normally-off region of the device and Gate 2 is design to sustain the high voltage from the drain.

The normally-off operation of the inventive device is described as follows: When the device is switched-off ($V_{gs}=0$ V), the voltage at the drain-side edge of the Gate 1 increases as the drain voltage increases. At the same time, the Gate 2-to-channel junction will become reverse biased. When the reverse biased voltage reaches the negative threshold voltage of the Gate 2, the channel under the Gate 2 is depleted and the voltage at the drain-side edge of Gate 1 stops increasing. Then, the rest of the drain voltage will drop at the drain-side edge of the Gate 2. To achieve the low leakage and high breakdown voltage, the key requirement of the new dual-gate normally-off device is that the magnitude of the threshold voltage of the Gate 2, $|V_{th,2}|$, is smaller than the drain breakdown or punch-through voltage, $V_{bk,1}$, of the Gate 1.

Therefore, the inventive dual-gate normally-off nitride transistor is different from a field-plate transistor structure, where the field plate is used to reduce the maximum electric field at the gate edge. In contrast to the field-plated device, the Gate 2 in the inventive device is designed to be able to modulate the channel underneath it and the electrons at the drain-side edge of the Gate 2 will quickly be depleted when the device operates in the pinch-off mode. In fact, field plate structure can be formed between the Gate 2 and the drain electrode to increase the breakdown voltage of the dual-gate device.

It is also different from the recessed gate GaN MIS-HEMTs and MIS-HFETs, where there is only one gate that mainly covers the normally-off region underneath it. In the invention, there exists two gates with Gate 1 covers a small area of normally-off region and Gate 2 covers a larger area of normally-on region. Both of the gates are able to modulate the channel underneath them and requires the matching of threshold voltage and punch-through voltage as described in the previous paragraph.

One of the different ways the inventive device can be fabricated is: 1) ohmic source-drain metallization; 2) isolation by $Cl_2$ based mesa etching or by implantation; 3) lithography for Gate 1 patterning with gate length of between 50 nm and 500 nm; 4) using the photoresist of the Gate 1 as a mask, recess or apply plasma treatment to the barrier in the Gate 1 region; 5) clean the sample and rapid thermal annealing between 600° C.~750° C. to recover any damage from gate recess if necessary; 6) deposit gate dielectric (such as $Ga_2O_3$, $Al_2O_3$, $HfO_2$, $SiO_2$, $SiN_2$) of 1 nm~150 nm using atomic layer deposition (ALD) or chemical vapor deposition (CVD); 7) anneal the gate dielectric between 400° C.~900° C., if necessary to increase the quality of the dielectric; 8) lithography for Gate 2 with a gate length between 0.5 μm~5 μm, and final gate metallization. The magnitude of the threshold voltage of the Gate 2 should be smaller than the breakdown or the punch-through voltage of the Gate 1.

One example of the dual-gate normally-off nitride transistor 150 has been fabricated with gate recess technology, as shown in FIG. 3A. The dual-gate normally-off nitride transistor 150 is fabricated on an $Al_{0.26}Ga_{0.74}N/GaN$ structure 155 grown on a Si substrate 156. The $Al_{0.26}Ga_{0.74}N$ barrier layer 166 thickness is about 17 nm. First, the source 152 and drain 154 ohmic contact are formed by Ti/Al/Ni/Au metallization annealed at 870° C. for 30 s in $N_2$. Then mesa isolation is formed by $BCl_3/Cl_2$ plasma etching. The Gate 1, about 100 nm long, was formed by electron beam lithography on PMMA photoresist followed by low damage $BCl_3/Cl_2$ gate recess 168 to remove portions of the AlGaN barrier layer 166 in the Gate 1 region. The etch depth should be enough to fully deplete the electrons from the Gate 1 region and it can even extend into the GaN channel 155 if necessary. The device was then annealed at 700° C. for 90 s in $N_2$ to recover the damage during the gate recess 168. A 14 nm $Al_2O_3$ gate dielectric layer 158 is deposited at 250° C. by ALD followed by 700° C. 90 s annealing in $N_2$. Finally, a 2 μm long Ni/Au/Ni gate was deposited covering the gate recessed region in Gate 1 with 1 μm drain side margin for Gate 2. This device has a gate-to-source distance of 1.5 μm and Gate-2-to-drain distance of 18 μm. The device width is 100 μm.

Figure 4B:
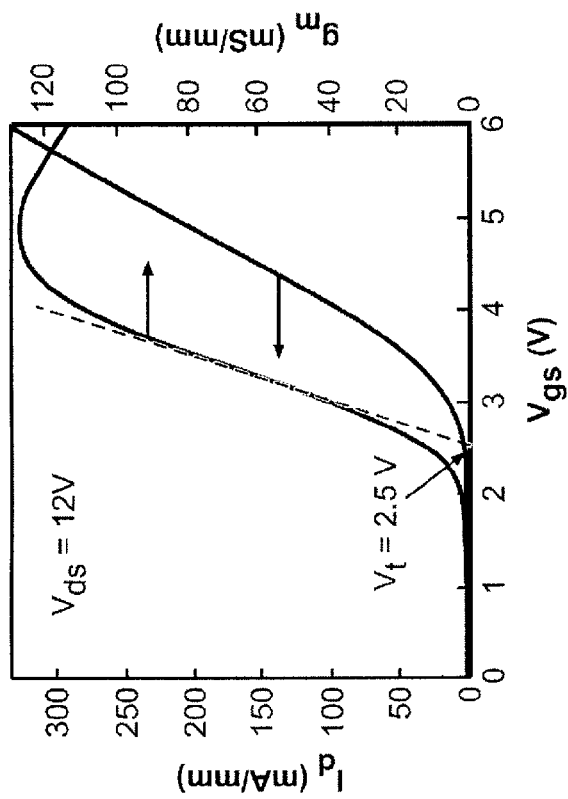
FIGS. 4A-4B are the measured DC characteristics of a fabricated dual-gate normally-off GaN HEMT.
Figure 4A:
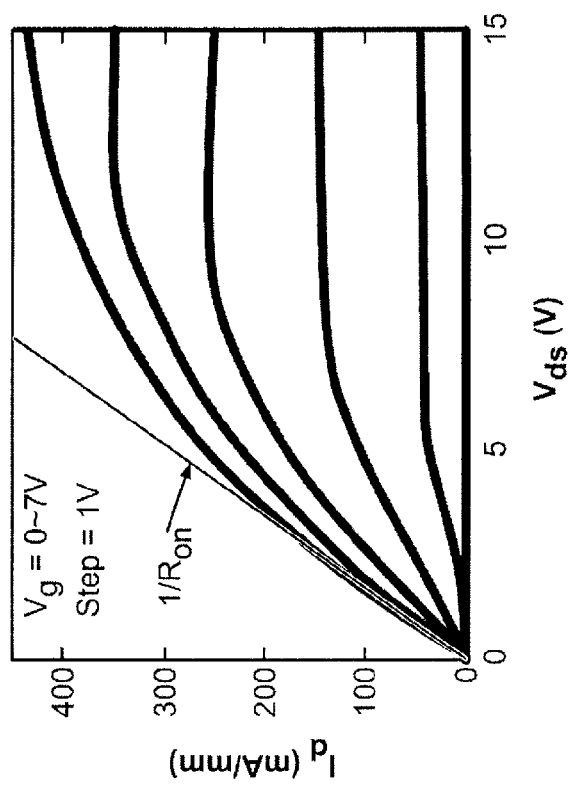

The DC characterization of this prototype dual-gate normally-off GaN HEMT 150 is shown FIGS. 4A-4B. The device shows the maximum drain current of 430 mA/mm at $V_{gs}=7$ V and $V_{ds}=15$ V, with a specific on-resistance ($R_{on} \times A$) of 4.1 mΩ·cm² calculated from the $I_d$-$V_{ds}$ curve, as shown in FIG. 4A, times the area, A, between the source and drain including a 2 μm transfer length from both the source and drain contacts. The threshold voltage is 2.5 V extrapolated from the $g_m$-$V_{gs}$ transfer characteristic curve, as shown in FIG. 4B. The maximum $g_m$ is 127 mS/mm.

Figure 5:
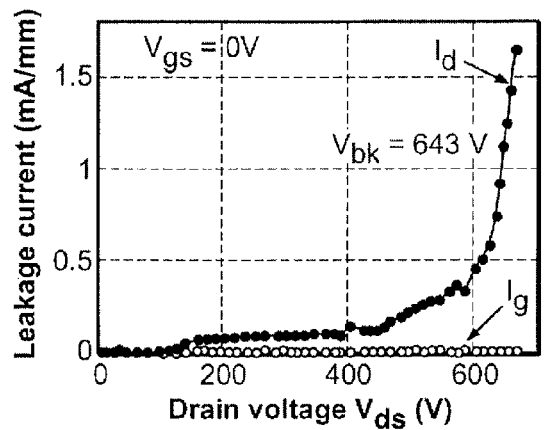
FIG. 5 is the measured breakdown voltage of the inventive dual-gate normally-off GaN HEMT.

The breakdown voltage of the prototype device 150 is measured using a Tektronix curve tracer with three Agilent 34401A multimeters to measure the voltage and gate and source leakage current. The breakdown voltage is defined as the voltage when the leakage current reaches 1 mA/mm. Fluorinert™ was used to prevent surface flashover during measurements. The voltage measurement accuracy is 1 V and current measurement accuracy is 10 nA. The breakdown voltage was measured at $V_{gs}=0$ V and the result is shown in FIG. 5. The device achieved breakdown voltage of 643 V with gate leakage less than the equipment sensitivity of 100 nA/mm.

Figure 6:
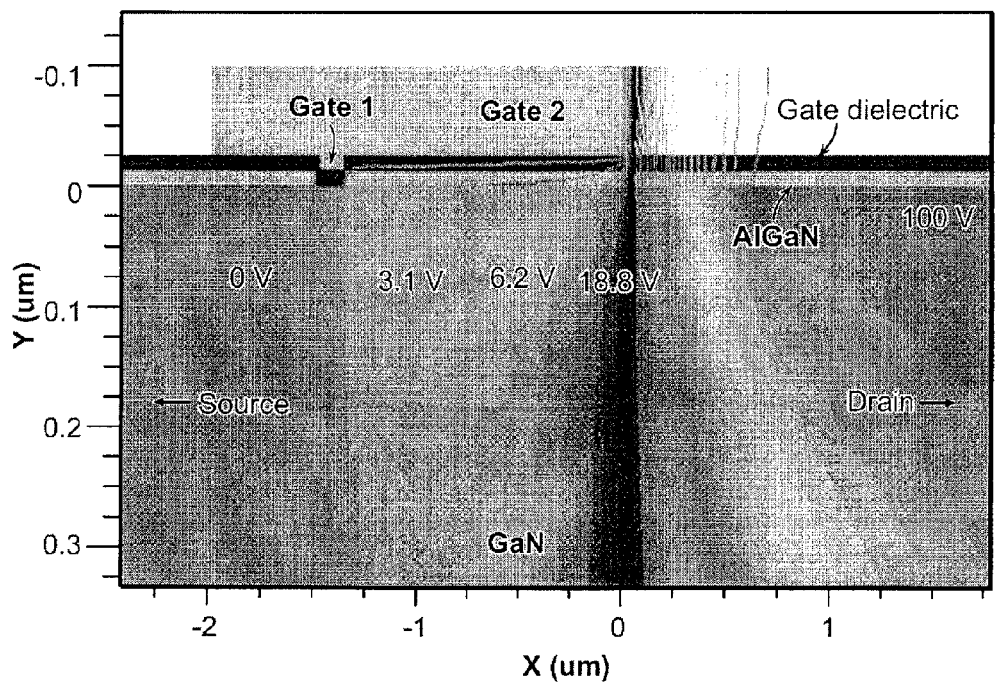
FIG. 6 is a graph illustrating the simulated potential distribution of the inventive dual-gate normally-off GaN HEMT.

A simulation of the electrostatic potential in such a device biased at $V_{gs}=0$, $V_{ds}=100$ V is shown in FIG. 6. The potential contour in the FIG. 6 shows that the most of the voltage drops at the edge of the Gate 2 and there is only 3.1 V at the Gate 1 edge.

The invention describes a new transistor structure and technology to fabricate normally-off nitride transistors. The inventive transistor structure can be fabricated using standard semiconductor fabrication technology. Second, the short gate length required for the normally-off behavior allows very low ON resistances. Third, the use of dielectric underneath the dual gate structure significantly reduces the gate leakage. Fourth, the inventive dual-gate normally-off technology is compatible with high temperature operation, which significantly reduces the power system costs due to the lower cooling requirements. By using the inventive dual-gate technology, low gate leakage, high breakdown voltage and robust normally-off nitride transistors can be fabricated, which will meet the great demand for the GaN-based power electronics.

Although the present invention has been shown and described with respect to several preferred embodiments thereof, various changes, omissions and additions to the form and detail thereof, may be made therein, without departing from the spirit and scope of the invention.

What is claimed is:

1. A dual-gate normally-off nitride transistor comprising:
a first gate structure formed between a source electrode and a drain electrode for controlling a normally-off channel region of the dual-gate normally-off nitride transistor, said first gate structure covers a first area of said normally-off channel region; and
a second gate structure formed between the first gate structure and the drain electrode for modulating a normally-on channel region underneath the second gate structure, said second gate structure covers a second area of said normally-on channel region;
wherein the magnitude of the threshold voltage of the second gate structure is smaller than the drain-to-source punch-through voltage of the first gate structure for proper operation of the dual-gate normally-off nitride transistor, the length of said second gate structure is longer than the length of said first gate structure.

2. The dual-gate normally-off nitride transistor of claim 1, wherein the first gate structure comprises a gate structure formed using gate recess, plasma treatment, surface potential modulation, polarization engineering, or p-type gate material.

3. The dual-gate normally-off nitride transistor of claim 1, wherein the first gate structure is positioned between the source electrode and the drain electrode on a region of a barrier layer.

4. The dual-gate normally-off nitride transistor of claim 1, wherein the second gate structure is positioned between the first gate structure and the drain electrode.

5. The dual-gate normally-off nitride transistor of claim 3, wherein the barrier layer comprises $In_yAl_xGa_{1-x-y}N$ ($0 \leq x,y \leq 1$, $x+y=1$).

6. The dual-gate normally-off nitride transistor of claim 1, wherein the source electrode and the drain electrode are in contact with a channel layer.

7. The dual-gate normally-off nitride transistor of claim 6, wherein the channel layer is positioned on a substrate.

8. The dual-gate normally-off nitride transistor of claim 1, wherein the second gate structure comprises an independent bias, connected to the source electrode or connected to the first gate structure.

9. The dual-gate normally-off nitride transistor of claim 1, wherein the second gate structure is integrated with the first gate structure when the second gate structure needs to be connected to the first gate structure.

10. The dual-gate normally-off nitride transistor of claim 1 further comprising a dielectric layer being positioned on a thin AlGa(In)N barrier layer.

11. A method of forming a dual-gate normally-off nitride transistor comprising:
forming a first gate structure between a source electrode and a drain electrode for controlling a normally-off channel region of the dual-gate normally-off nitride transistor, said first gate structure covers a first area of said normally-off channel region; and
forming a second gate structure between the first gate structure and the drain electrode for modulating a normally-on channel region underneath the second gate structure, said second gate structure covers a second area of said normally-on channel region, wherein the magnitude of the threshold voltage of the second gate structure is smaller than the drain-to-source punch-through voltage of the first gate structure for proper operation of the dual-gate normally-off nitride transistor, the length of said second gate structure is longer than the length of said first gate structure.

12. The method of claim 11, wherein the first gate structure comprises a gate structure formed using gate recess, plasma treatment, surface potential modulation, polarization engineering, or p-type gate material.

13. The method of claim 11, wherein the first gate structure is positioned between the source electrode and the drain electrode on a region of a barrier layer.

14. The method of claim 11, wherein the second gate structure is positioned between the first gate structure and the drain electrode.

15. The method of claim 13, wherein the barrier layer comprises $In_yAl_xGa_{1-x-y}N$ ($0 \leq x, y \leq 1$, $x+y=1$).

16. The method of claim 11, wherein the source electrode and drain electrode are in contact with a channel layer.

17. The method of claim 16, wherein the channel layer is positioned on a substrate.

18. The method of claim 11, wherein the second gate structure comprises an independent bias, connected to the source electrode or connected to the first gate structure.

19. The method of claim 11, wherein the second gate structure is integrated with the first gate structure when the second gate structure needs to be connected to the first gate structure.

20. The method of claim 11 further comprising a dielectric layer being positioned on a thin AlGa(In)N barrier layer.

21. A transistor-based power device comprising:
a first gate structure formed between a source electrode and a drain electrode for controlling a normally-off channel region of the dual-gate normally-off nitride transistor, said first gate structure covers a first area of said normally-off channel region; and
a second gate structure formed between the first gate structure and the drain electrode for modulating a normally-on channel region underneath the second gate structure said second gate structure covers a second area of said normally-on channel region;
wherein the magnitude of the threshold voltage of the second gate structure is smaller than the drain-to-source punch-through voltage of the first gate structure for proper operation of the dual-gate normally-off nitride transistor, the length of said second gate structure is longer than the length of said first gate structure.

* * * * *